United States Patent
Gluschenkov et al.

(12)

(10) Patent No.: US 6,555,166 B2
(45) Date of Patent: Apr. 29, 2003

(54) METHOD FOR REDUCING THE MICROLOADING EFFECT IN A CHEMICAL VAPOR DEPOSITION REACTOR

(75) Inventors: Oleg Gluschenkov, Wappingers Falls, NY (US); Ashima B. Chakravarti, Hopewell Junction, NY (US)

(73) Assignee: International Business Machines, Armonk, NY (US)

( * ) Notice: Subject to any disclaimer, the term of this patent is extended or adjusted under 35 U.S.C. 154(b) by 39 days.

(21) Appl. No.: 09/895,378

(22) Filed: Jun. 29, 2001

(65) Prior Publication Data

US 2003/0035884 A1 Feb. 20, 2003

(51) Int. Cl.⁷ .............................................. C23C 16/00
(52) U.S. Cl. ....................................... 427/248.1; 427/8
(58) Field of Search ................................. 427/248.1, 8

(56) References Cited

U.S. PATENT DOCUMENTS

| 5,320,708 A | * | 6/1994 | Kadomura et al. ......... 156/662 |
| 5,384,009 A | | 1/1995 | Mak et al. |
| 5,620,615 A | | 4/1997 | Keller |
| 6,051,503 A | * | 4/2000 | Bhardwaj et al. ........... 438/705 |
| 6,090,717 A | | 7/2000 | Powell et al. |

FOREIGN PATENT DOCUMENTS

| EP | 0 805 485 A2 | 5/1997 |
| JP | 4-214625 | 8/1992 |
| JP | 5-283374 | 10/1993 |
| JP | 6-163465 | 6/1994 |
| JP | 8-335631 | 12/1996 |
| JP | 11-219938 | 8/1999 |

OTHER PUBLICATIONS

Journal of Vacuum Science and Technology B—vol. 17, Issue 5—International Conference on Advanced Materials and Processes for Microelectronics, San Jose, Mar. 15–19, 1999, pp 2311–20.

Advanced Metallization and Interconnect Systems for ULSI Applications in 1996, Proceedings of (Materials Research Society) Conference, Boston, Oct. 1–3, 1996, pp511–15.

Journal of the Electrochemical Society, vol. 143, issue 8, Aug. 1996, pp 2624–31.

Journal of Vacuum Science and Technology B—vol. 14, Issue 2, Mar./Apr. 1996, pp 724–26.

Journal of the Electrochemical Society—vol. 144, Issue 11, Nov. 1997, pp 3945–51.

Chemical Vapor Deposition, Proceedings of International Conference, 14th, and EUROCVD–11, Paris, Sep. 5–9, 1997 (Electrochemical Society Proceedings, vol. 97–25) pp. 254–61.

* cited by examiner

*Primary Examiner*—Bret Chen
(74) *Attorney, Agent, or Firm*—RatnerPrestia; Jay H. Anderson, Esq.

(57) ABSTRACT

A method is provided for reducing the microloading effect in a CVD process for depositing a film on a substrate. This method is particularly useful in a single-wafer CVD reactor. The microloading effect is reduced by identifying a growth-rate-limiting reactant; calculating a dilution factor (the ratio of the gas flow rate of the growth-rate-limiting reactant to the total gas flow rate in the reactor); and adjusting the film growth rate and/or the dilution factor to satisfy a numerical criterion for reducing the microloading effect. The criterion is satisfied when the film growth rate is reduced, or the dilution factor is increased, so that the dilution factor is equal to or greater than a quantity which includes the film growth rate as a factor. The film growth rate and dilution factor may be adjusted independently. The gap between the showerhead and the substrate in the CVD reactor may be adjusted to satisfy the numerical criterion. The gap may advantageously be reduced to less than 5 mm, preferably to about 100 $\mu$m. A gap in the range 50 $\mu$m–5 mm reduces a characteristic distance which is a factor in the above-mentioned quantity, so that the criterion becomes easier to meet.

20 Claims, 6 Drawing Sheets

METHOD FOR REDUCING THE MICROLOADING EFFECT IN A CHEMICAL VAPOR DEPOSITION REACTOR

FIELD OF THE INVENTION

The present invention relates to the deposition of thin films on a substrate by chemical vapor deposition and, in particular, to a method by which such films may be deposited uniformly in a pattern that has varying density.

BACKGROUND OF THE INVENTION

Fabrication of electrical, optical or mechanical microdevices typically includes the sequential steps of substrate patterning (lithography), material subtraction (etching), and material addition (deposition). Often, it is desirable to deposit uniform thin films over dense three-dimensional microstructures. A collection of the microdevices, often referred to as microchips, may have different pattern densities. This requires the deposition of a thin uniform film over an area having a varying pattern density.

Because the area over which the film is deposited is larger for a more dense pattern, more chemical reactants are consumed in the vicinity of such dense areas. Increased consumption of such chemicals can lead to a localized depletion of chemically active species and a reduction in the growth rate of the film being deposited. The growth rate is the rate at which the film thickness builds up when the build-up increases linearly with time, or the total thickness of the film divided by the period of time required to develop the total thickness. When the growth rate is reduced in the more dense locations of the pattern, the film in the vicinity of the more dense locations of the pattern is thinner than at other locations where the pattern is less dense.

The variation of film thickness with pattern density will be referred to herein as the icroloading effect. The term "microloading effect" is commonly used in the art of reactive on etching (RIE), where it refers to the etch rate dependence on the pattern density. By analogy, we define the microloading effect for various deposition techniques. The deposition-based microloading effect should not be confused with the loading effect and the conformality (step-coverage) phenomenon. Both the loading effect and the step-coverage phenomenon are well known in the deposition art. The loading effect refers to the growth rate variation of a film from wafer to wafer. Accordingly, the loading effect has a much larger scale than the microloading effect. The loading effect is commonly observed in a Low Pressure Chemical Vapor Deposition (LPCVD) furnace where the composition of the reactive gas mixture changes along the furnace tube (reactor), leading to a growth rate variation along the tube. Due to the large scale of the loading effect the wafer-to-wafer growth rate variation can be easily reduced by either creating a small temperature gradient along the tube or introducing reactive chemicals through a plurality of apertures along the furnace tube. In contrast, due to the small scale of the microloading effect it is impractical to use the above-described techniques; it would be extremely costly to create a temperature gradient within a single chip or to provide means for independent delivery of chemicals to different parts of the same chip.

On the other hand, the step-coverage phenomenon has a much smaller scale than that of the microloading effect. In the deposition art, the step-coverage phenomenon refers to the film thickness (growth rate) variation with a single microstructure such as step, trench, or pillar. At the scale of less than several micrometers, step coverage is governed by very different physical mechanisms compared to the microloading effect. For example, the surface mobility of adsorbed chemicals can greatly contribute to the uniformity of the deposited films over 3-D microstructures. On the contrary, the surface mobility of adsorbed chemicals is not important at the scale of the microloading effect (several hundreds of micrometers). Therefore, the deposition-based microloading effect is easily differentiated from both the loading effect and the step-coverage phenomenon on the basis of substantially different scale.

As noted above, the microloading effect is ordinarily due to depletion of one of the chemicals participating in the reaction. The depleted chemical is referred to herein as a rate-limiting reactant. Even though the geometrical scales of microloading and loading effects are different, both effects are due to depletion of one of the chemicals participating in the reaction.

In the practice of chemical vapor deposition (CVD) of thin films, it is known that the loading effect is substantially reduced when the film growth is limited by the speed of the surface reaction and not by the speed of mass transport of chemicals. In order to perform CVD in such a surface-reaction-limited regime, it has been suggested that the growth rate be reduced by reducing the process temperature and pressure in the reactor. Most LPCVD furnaces are designed to operate in the surface-reaction-limited regime and have a relatively small loading effect. Due to the same reason, LPCVD furnaces have a relatively small microloading effect.

Recent trends in microfabrication clearly are directed toward shorter processing times, reduced thermal budget, and processing of large substrates. A new type of CVD reactor, characterized as a rapid thermal reactor, appears to satisfy these demands. A rapid thermal CVD reactor is a single-wafer unit that processes one wafer at a time. A schematic illustration of a first type of conventional single-wafer CVD reactor is shown in FIG. 1. This type of reactor is used to deposit various films of desired thickness onto a substrate 12. The chemical vapor deposition reactor includes a substrate susceptor 13 which has a resistive heater powered by a source 24. The heater can have multiple heating zones controlled independently by control circuitry (not shown). The mixture of chemicals includes one or more growth rate-limiting reactants and one or more other reactants, all of which can be optionally carried by a neutral gas. These gases are introduced into a showerhead 10 through a plurality of gas inlets 16, 18, 20. (In FIG. 1, as in other FIGS., the connections between the inlets and the showerhead are omitted for the sake of clarity.) After mixing in the showerhead the gases are injected into the process chamber through a plurality of apertures. The relatively small conductance of the apertures provides a substantial pressure difference between the process chamber and the interior of the showerhead. The gas conductance of the apertures can be varied center to edge to create a uniform gas flow in the gap between the substrate and the showerhead.

Reactants are selected according to the composition of the film being deposited on the substrate and the desired chemical reaction. For example, for silicon nitride ($Si_3N_4$) deposition, silane ($SiH_4$) and ammonia ($NH_3$) may be selected as the reactants. Generally, this choice is determined by the desired composition of the film being deposited on the substrate and an acceptable film growth rate.

The carrier gas is generally used to aid in the delivery of the reactants to the process chamber. The carrier gas is normally nitrogen ($N_2$) or hydrogen ($H_2$). In general, the carrier gas may be any of the inert gases, such as helium, neon, argon, or xenon. Gases other than nitrogen are more expensive and therefore are less commonly used.

After a film 14 of desired thickness has been deposited on substrate 12, the reactor chamber is evacuated by pumps (not shown) that are connected to outlets 22, 23. The back side of susceptor 13 is optionally purged during the film deposition by the introduction of a purging gas, such as nitrogen, which is introduced through an inlet 26. The purge reduces the deposition of the film onto the susceptor.

FIG. 2 is a schematic illustration of a second type of conventional CVD reactor that is arranged differently from the CVD reactor of FIG. 1. In the arrangement of FIG. 2, the growth-rate-limiting reactants, other reactants and carrier gas are introduced through inlet 26 and exit through outlet 28 which is connected to a pump (not shown). The reactor chamber is heated by lamp heaters 30 and 32 disposed above and below substrate 12, on which the film 14 is deposited. The reactor can be equipped with a wafer/susceptor spinning mechanism (not shown). In a typical single wafer CVD chamber of the first type (FIG. 1), a patterned wafer is placed 0.5 to 10 cm away from the gas source. In a typical single wafer CVD chamber of the second type (FIG. 2), a patterned wafer is placed 1.0 to 20 cm away from the chamber wall. The flow of gases is controlled with mass flow controllers (MFCs) 25, shown schematically in FIGS. 1 and 2. An MFC supplies a predetermined number of gas molecules per unit of time into the chamber. The chamber pressure is maintained constant with an adjustable valve 27 between the pump and the chamber.

Compared to CVD furnaces, a rapid thermal CVD reactor permits shorter processing time, greater manufacturing flexibility, and reduced thermal budget. In order to achieve these benefits, a rapid thermal CVD reactor has a high film deposition growth rate in comparison to the growth rate in a low pressure CVD furnace. The high growth rate of the deposited film in the rapid thermal CVD reactor makes this type of reactor very susceptible to the microloading effect. Furthermore, a rapid thermal CVD reactor may have a large temperature gradient that normally does not occur in a thermally stabilized low pressure CVD furnace. Such a temperature gradient may aggravate the microloading effect.

Accordingly, there is a need for a method for controlling the deposition of a film in a CVD reactor, particularly in a single-wafer, rapid thermal reactor, so that the microloading effect is reduced or avoided.

SUMMARY OF THE INVENTION

The present invention addresses the above-described need by providing a method for reducing the microloading effect in a CVD process for depositing a film on a substrate. This method is particularly useful in a single-wafer CVD reactor.

In accordance with a first aspect of the the present invention, the microloading effect is reduced by identifying a growth-rate-limiting reactant, calculating a dilution factor (the ratio of the gas flow rate of the growth-rate-limiting reactant to the total gas flow rate in the reactor); and adjusting the film growth rate and/or the dilution factor to satisfy a numerical criterion for reducing the microloading effect. The criterion is satisfied when the film growth rate is reduced, or the dilution factor is increased, so that the dilution factor is equal to or greater than a quantity which includes the film growth rate and the variation of substrate surface area as factors. The process generally has a minimum film growth rate (due to process throughput requirements) and a maximum dilution factor (due to film quality requirements). The film growth rate and dilution factor may be adjusted independently.

The substrate on which the film is deposited generally has a microstructure with a characteristic size, an aspect ratio and a pattern density. A second quantity may be evaluated based on these factors to determine the susceptibility of the substrate to the microloading effect.

In accordance with another aspect of the invention, the gap between the showerhead and the substrate in the CVD reactor is adjusted to satisfy the numerical criterion. In particular, the gap may advantageously be reduced to less than 5 mm, preferably to about 100 $\mu$m. Providing a gap in the range 50 $\mu$m–5 mm reduces a characteristic distance which is a factor in the above-mentioned quantity, so that the criterion becomes easier to meet.

In accordance with another aspect of the invention, the molecular weight of the carrier gas in the gas mixture is selected so that the mean molecular weight of the gas mixture is greater than the molecular weight of the growth-rate-limiting reactant. This choice of molecular weights eases the transport of rate-limiting chemical due to thermal diffusion. Since the above-mentioned quantity has as a factor an expression including these molecular weights, such a selection makes the criterion easier to meet in the presence of strong thermal gradients.

It is noteworthy that the present invention may be practiced in a high-throughput single-wafer CVD reactor and with a variety of film deposition processes.

DETAILED DESCRIPTION OF PREFERRED EMBODIMENTS OF THE INVENTION

A method will be described for reducing the microloading effect in a CVD reactor wherein a silicon nitride film is deposited on a substrate using silane and ammonia as reactant gases and nitrogen as a carrier gas. It will be appreciated that this is but an example of the present invention, and that the method of the present invention may be applied to a variety of CVD processes and gas mixtures. In particular, the present invention may be practiced in the CVD of (1) silicon nitride, $SiN_x$, using $NH_3$, $NH_x$, radicals, $H_3N$ (hydrozine), or atomic nitrogen and $Si_2H_6$, $SiCl_4$, $SiH_2Cl_2$, $SiHCl_3$, $Si_2H_6Cl_6$, or "BTBAS"; (2) pure and doped $SiO_2$, $SiO_x$, PSG, BSG, FSG, or BPSG using $O_2$ or $N_2O$ and TEOS and/or $SiH_4$ and $PH_3$, $B_2H_6$, or $NF_3$; (3)

high-temperature silicon oxide using $N_2O$, NO, or $O_2$ and $Si_2H_6$, $SiCl_4$, $SiH_2Cl_2$, $SiHCl_3$, or $Si_2H_6Cl_6$; (4) W (tungsten) and/or $WSi_x$ (tungsten silicide) using $WF_6$ or $W(CO)_6$ as tungsten precursors; (5) high-dielectric-constant films such as $Al_2O_3$, $HfO_x$, $ZrO_x$, AlN, $HfSi_xO_y$ etc; and (6) conductive diffusion barriers such as $TiN_x$, $WN_x$, $WSi_xN_y$, $HfN_x$, etc.

The microloading effect in a CVD process is normally due to depletion of one of the chemicals participating in the reaction. The supply of this growth-rate-limiting reactant determines the speed of deposition of the film on the substrate. The non-growth-rate-limiting reactants are in such abundance that a variation in the supply of these reactants does not change the growth rate of the film. The carrier gas facilitates the transport of the reactants (including the grow-rate-limiting reactant) but does not participate in the reaction.

Rate-limiting Chemical and Film Growth Rate

The concentration of a reactant can be roughly approximated as follows:

$$[reactant] = \frac{P}{kT} \frac{Q}{Q_{tot}} \quad (1)$$

where the square brackets [reactant] refer to the concentration (number density) of a reactant, P is the chamber pressure, Q, is the reactant flow rate, $Q_{tot}$ is the total rate of all gases flowing through the chamber, T is the gas temperature, and k is the Boltzmann constant.

Figure 1:
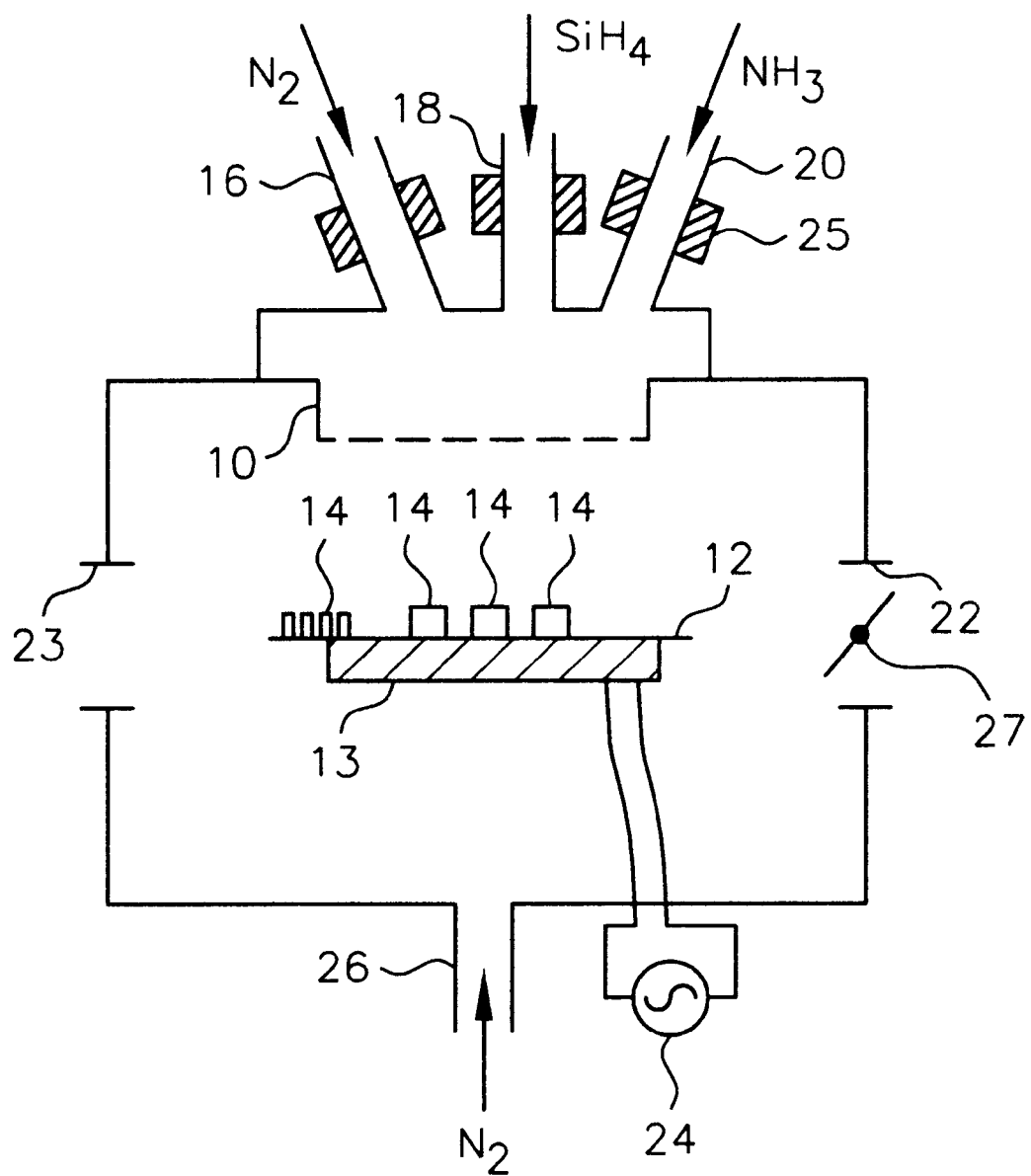
FIG. 1 is a schematic illustration of a first type of conventional single-wafer CVD reactor.
Figure 2:
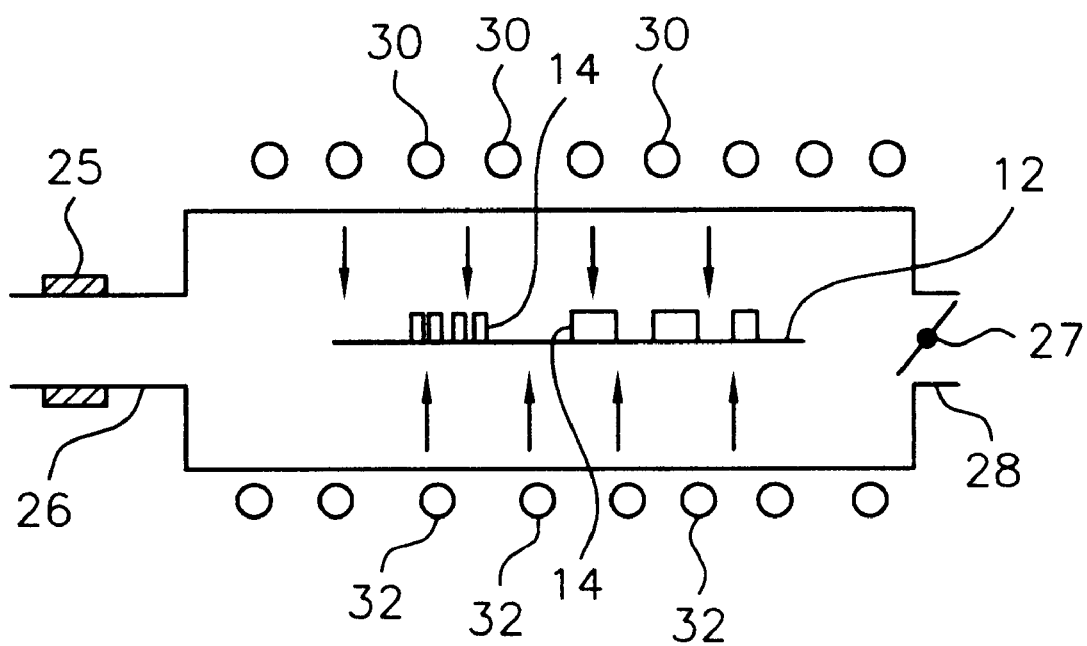
FIG. 2 is a schematic illustration of a second type of conventional single-wafer CVD reactor.
Figure 3:
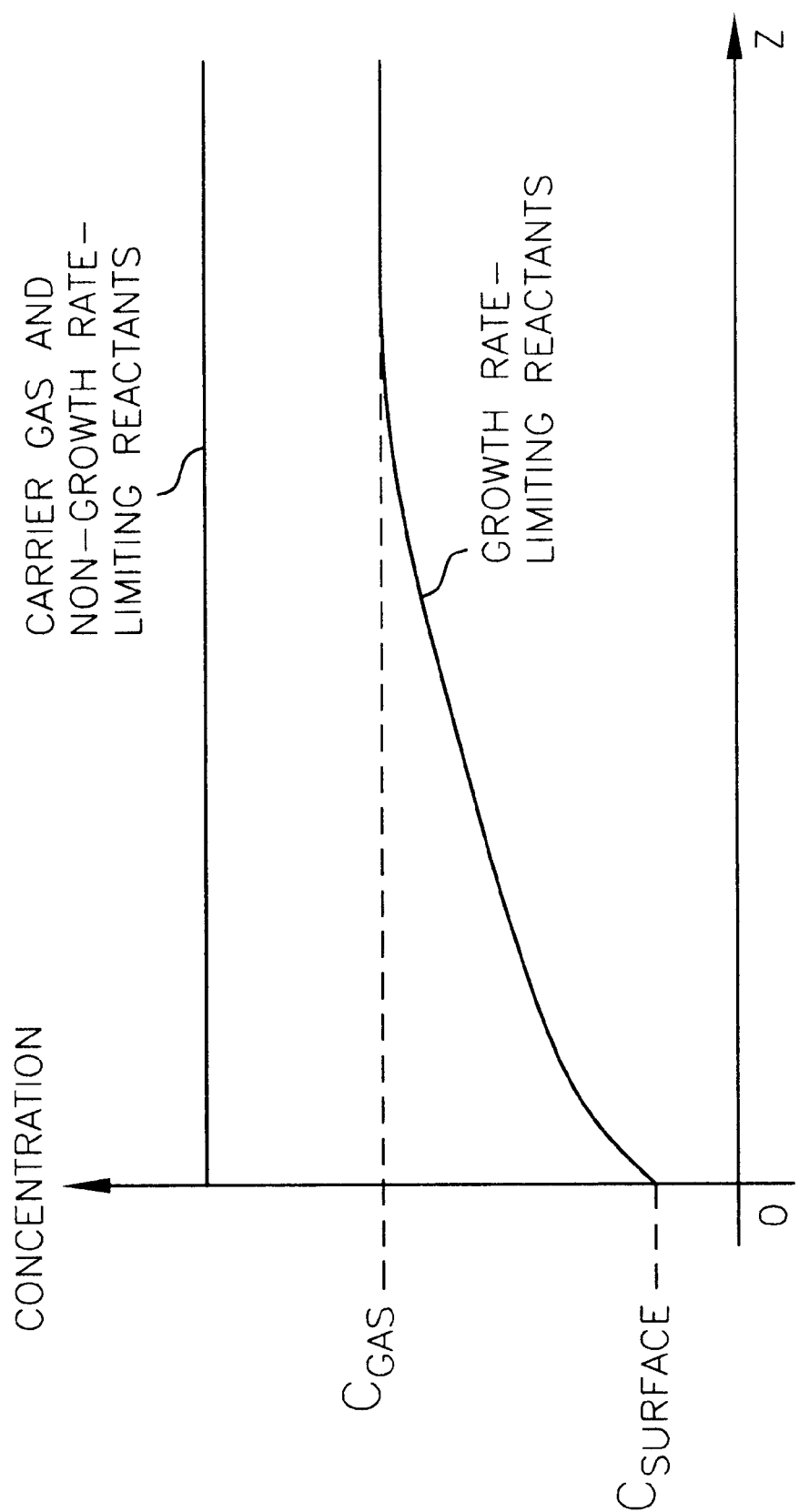
FIG. 3 shows the vertical distribution of reactant concentrations above the surface of a substrate on which a film is being deposited.

FIG. 3 shows the vertical distribution of reactant concentrations above the surface of a substrate on which a film is being deposited. The concentrations of the non-growth-rate-limiting reactants and the carrier gas are relatively constant in the the stagnant gas layer near the wafer (discussed in more detail below), while growth-rate-limiting reactants are depleted at the surface of the substrate (compare concentration $C_{surface}$ at the surface with concentration $C_{gas}$ above the surface). As noted above, a substantial depletion of a reactant at the surface of the substrate leads to the microloading effect.

Figure 4:
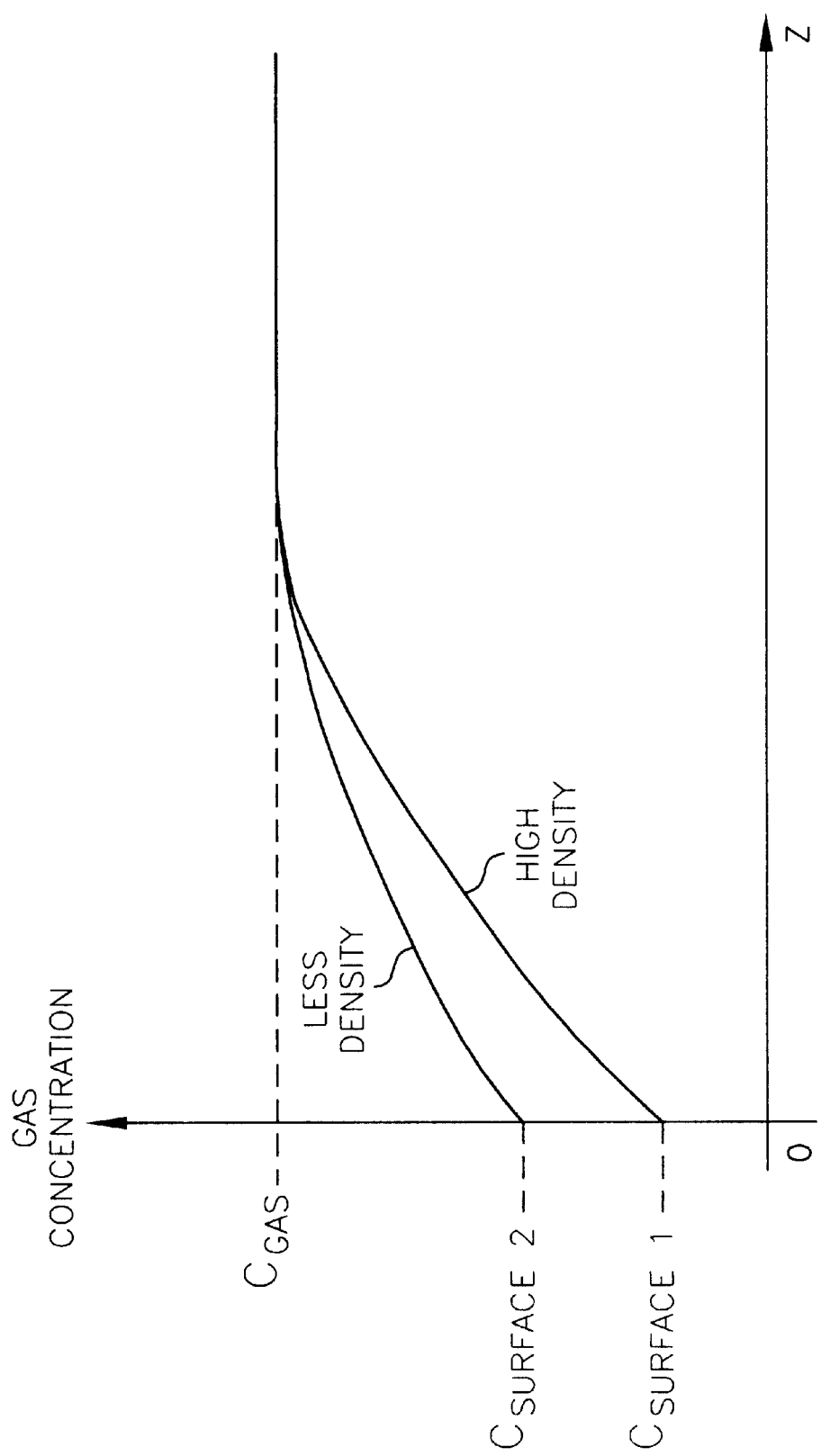
FIG. 4 shows two vertical distributions of reactant concentrations above the surface of a substrate on which a film is being deposited at different locations along the surface of the substrate.
Figure 5:
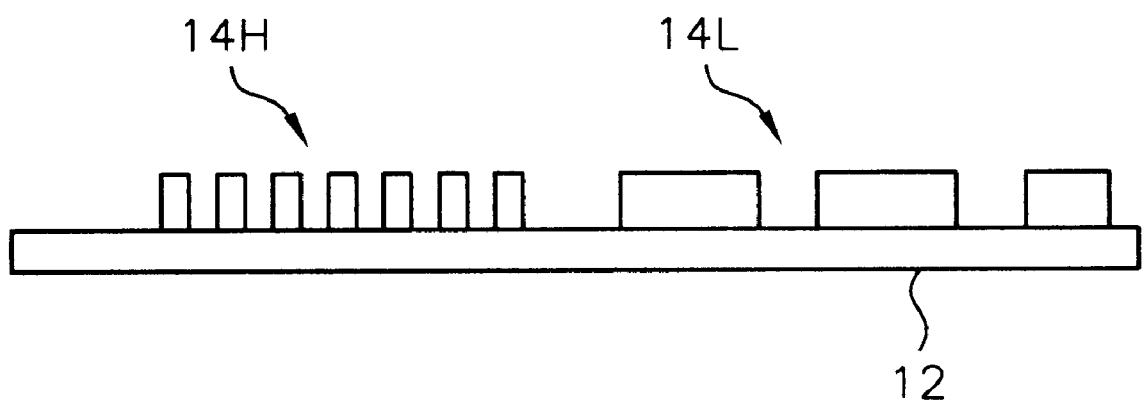
FIG. 5 is a detail view of a film deposited on a substrate, with high-density and low-density film patterns at different locations along the surface of the substrate.

FIG. 4 shows two vertical distributions of reactant concentrations above the surface of a substrate on which a film is being deposited at different locations along the surface of the substrate. The pattern at one location is very dense (high density film pattern 14H, as shown in FIG. 5) so that the reactant concentration at the surface is $C_{surface1}$, while the pattern at another location is less dense (low density film pattern 14L), so that the reactant concentration at the surface is $C_{surface2}$. As indicated in FIG. 4, areas of different pattern density (that is, effective surface area) have different levels of depletion of reactants, and therefore have different rates of deposition of the film (and thus exhibit a microloading effect).

A minimum acceptable film growth rate must be established for the CVD reactor and process. This is an important constraint which must be observed in the procedure for reducing the microloading effect. The minimum acceptable growth rate is dependent on various factors that bear on the cost of manufacture of the finished wafers, including the throughput of the reactor and the cost of the reactant chemicals. In a rapid thermal CVD reactor which processes only one wafer at a time, the minimum growth rate is often set at 1 Å/sec.

The growth-rate-limiting reactant (or reactants) must be identified for the particular deposition reaction which is desired. The rate-limiting reactant is determined in a set of experiments in which the concentration of the reactant is varied while keeping other parameters the same. This can be accomplished by changing the reactant's flow rate Q while keeping the total flow constant. For example, in the case of rapid thermal CVD of a silicon nitride film, we have found that the growth rate scales linearly with the concentration of silane $[SiH_4]$ while the concentration of ammonia $[NH_3]$ does not affect the growth rate. From this analysis we can conclude that $SiH_4$ is the rate-limiting reactant.

The rate of consumption of a rate-limiting chemical is connected to the film growth rate by the following relationship:

$$A \frac{d[SiH_4]_s}{dt} = A_{tot} r [Si]_{SiN} \quad (2)$$

where $[SiH_4]_s$ is the concentration of $SiH_4$ close to the wafer surface, r is the growth rate of SiN film, $[Si]_{SiN}$ is the density of Si atoms in the grown SiN film, A is a relatively large area of interest (a portion of the chip which will be defined later), and $A_{tot}$ is the total chip surface area within the area of interest.

Diffusion of the Rate-limiting Chemical

In a steady case, the rate of consumption of a rate-limiting chemical is balanced with the supply of the chemical to the wafer surface. Such supply is mostly diffusion driven. As understood by those skilled in the art, the diffusion process in wafer processing equipment can be adequately approximated using the concept of stagnant layer (see S. Wolf et al., "Silicon Processing for the VLSI Era, Vol. 1: Process Technology" (Sunset Beach, Calif.: Lattice Press, 1986)). The stagnant gas layer is formed near the wafer surface due to friction between the gas and the substrate. In order to support a certain diffusion rate, a certain concentration gradient must exist across the stagnant layer. This requirement can be expressed as:

$$j_{diff} = D_{SiH_4} \frac{[SiH_4]_0 - [SiH_4]_s}{\delta} \quad (3)$$

where $[SiH_4]_0$ is the concentration of silane outside the stagnant layer, $[SiH_4]_s$ is the concentration of silane close to the wafer surface, $D_{SiH_4}$ is the diffusion coefficient of silane molecules in the process gas mixture, and $\delta$ is the stagnant layer thickness.

The consumption-supply balance can be written as follows:

$$A \frac{d[SiH_4]}{dt}\bigg|_s = A j_{diff} \text{ or} \quad (4)$$

$$A_{tot} r [Si]_{SiN} = A D_{SiH_4} \frac{[SiH_4]_0 - [SiH_4]_s}{\delta}. \quad (5)$$

It is also known from chemical kinetics that the concentration of a rate-limited reactant near the surface is connected to the growth rate through $$r = \beta [SiH_4]_s^\gamma \quad (6)$$

where $\beta$ is a constant of proportionality that depends on the wafer temperature and the concentration of other chemicals participating in the reaction and $\gamma$ is the exponential factor. Coefficients $\beta$ and $\gamma$ are generally found in a set of experiments where the growth rate is measured as a function of silane concentration. We have found that the exponential factor $\gamma$ is close to unity.

Eqs. (5) and (6) can be used to estimate the concentration of silane near the surface $[SiH4]_s$ and the growth rate r:

$$r = \beta \frac{D_{SiH_4} \delta^{-1}}{\beta \frac{A_{tot}}{A}[Si]_{SiN} + D_{SiH_4}\delta^{-1}}[SiH_4]_{r1}. \quad (7)$$

Eq. (7) can be used to quantify the one dimensional microloading effect. For instance, if one can identify two areas on the same substrate, remote from each other, with substantially different $A_{tot}$, then Eq. (7) gives an estimate of the growth rate difference. If $r_1$ is the growth rate in the area with $A_{tot1}$ and $r_2$ is the growth rate in the area with $A_{tot2}$, then $$\frac{r_1 - r_2}{r_1} = \frac{(\alpha_2 - \alpha_1)\beta[Si]_{SiN}}{\beta\alpha_2[Si]_{SiN} + D_{SiH_4}\delta^{-1}} \quad (8)$$

where $\alpha = A_{tot}/A$. The parameter $(\alpha_2 - \alpha_1)$ thus characterizes the variation of surface area of the substrate between the two areas.

Eq. (8) provides a mathematical criterion for keeping the growth rate variation within a specified limit. If it is desired to keep the growth rate variation within a factor of $\epsilon$, then Eq. (8) becomes an inequality:

$$\frac{r_1 - r_2}{r_1} = \frac{(\alpha_2 - \alpha_1)\beta[Si]_{SiN}}{\beta\alpha_2[Si]_{SiN} + D_{SiH_4}\delta^{-1}} \leq \xi \quad (9)$$

Using Eqs. (6) and (7), Eq. (9) can be rearranged to $$\frac{[SiH_4]_0 D_{SiH_4}}{r_1 \delta [Si]_{SiN}} \geq \frac{1-\xi}{\xi}(\alpha_2 - \alpha_1) \quad (10)$$

Eq. (10) defines the space of processing parameters (left hand side) as a function of chip geometry (parameters $\alpha_1$ and $\alpha_2$) and acceptable degree of microloading (parameter $\epsilon$). For instance, if the chip surface varies from a substantially flat region ($\alpha_1=1$) to a densely packed periodic structure with $\alpha_2=3$ and one requires no more than 5% difference in the growth rate ($\epsilon=0.05$), the right hand side of the Eq. (10) becomes 38. It should be noted that CVD of silicon nitride was used here as an example. Eq. (10) can be generalized to the CVD of any film:

$$\frac{[RLC]_{gas} D_{RLC}}{[RLE]_{film} r_1 \delta} \geq \frac{1-\xi}{\xi}(\alpha_2 - \alpha_1) \quad (11)$$

where $[RLC]_{gas}$ is number density of the rate-limiting chemical (RLC) away from the substrate, $D_{RLC}$ is the diffusion coefficient of RLC in the processing gas, $[RLE]_{film}$ is the number density of the rate-limiting element (the element supplied with the RLC) in the grown film, $r_1$ is the film growth rate on the surface with $\alpha_1$, and $\delta$ is the stagnant layer thickness.

Flow Rate Criterion for Avoiding the Microloading Effect

Eqs. (10) and (11) can be rearranged further in order to express the criterion for microloading-free deposition in terms of parameters which can be easily controlled and monitored in CVD reactors. The concentration of RLC can be expressed in terms of flow rates and pressure using Eq. (1). The diffusion coefficient can be expressed in terms of the gas pressure using the well-known kinetic theory of gases. The stagnant layer thickness can be approximated through the characteristic Reynolds number of the gas flow, as is understood by those skilled in the art. These relationships can be found in R. B. Bird et al., "Transport Phenomena" (New York: John Wiley & Sons, 1960), and are reproduced here for convenience:

$$D = 1.41 \frac{\sqrt{T^3(M_{RLC}^{-1} + M_{mean}^{-1})}}{P\sigma_{RLC}^2 \Omega_{RLC}} \left[\frac{cm^2}{s}\right] \quad (12)$$

$$\delta = 0.67 \frac{L}{Re_L^{0.5}} \quad (13)$$

$$Re_L = \frac{2Q_{tot} M_{mean} m_0}{L \mu_{gas}} = 3.75 \cdot 10^4 \frac{2Q_{tot} m_0}{L} \sigma^2 \Omega_v \sqrt{\frac{M_{mean}}{T}} \quad (14)$$

where D is the diffusion coefficient in $cm^2 s^{-1}$, T is the gas temperature in °K, $M_{RLC}$ is the molecular weight of RLC, $M_{mean}$ is the average molecular weight of the gas mixture, P is the chamber pressure in Torr, $\delta$ is the average thickness of the stagnant layer, L is the characteristic length of the susceptor in cm, $Re_L$ is Reynolds number for the gas flow, $\mu_{gas}$ is the gas viscosity, $m_0$ is the atomic unit of mass ($1.66 \times 10^{-24}$ g), $Q_{tot}$ is total gas flow in molecules/sec, $\sigma_{RLC}$ and $\sigma$ are the cross section parameters in units of Ångstroms, and $\Omega_{RLC}$ and $\Omega_v$ are dimensionless slow-varying functions of gas temperature related to the size of the molecule.

As an example, in a silicon nitride CVD process using a reactive mixture of $SiH_4$ and $NH_3$ and $N_2$ as a carrier gas, typical wafer and deposition parameters are $\alpha_1=1$, $\alpha_2=3$, $\epsilon=0.05$, T=1073°K (800° C.), L=10 cm, $Q_{tot}$=10 slm=4.463×$10^{20}$ s$^{-1}$, $M_{mean}$=23, $M_{RLC}$=32, $\sigma_{RLC}$=3.85Å, $\Omega_{RLC}$=0.79, $\sigma$=4.0Å, $\Omega_v$=0.9, $[Si]_{SiN}$=3.6×$10^{22}$ cm$^{-3}$. Eqs. (12)–(14) give the following estimates:

$$D_{SiH4} = \frac{1160}{P} \frac{cm^2}{s} \quad (15)$$

$$Re_L = 11.7 \quad (16)$$

$$\delta = 2.0 \text{ cm} \quad (17)$$

The stagnant layer thickness is of the order of the gap thickness (distance between the wafer and the chamber wall or the gas showerhead). We have found that, if the estimated thickness of the stagnant layer is larger than the actual dimension of the gap, the gap width should be used as an estimate for the parameter $\delta$. For instance, if the actual gap width is 500 mil (1.27 cm) than the parameter $\delta$ in Eqs. (10) and (11) can be estimated as 1.27 cm.

Using Eqs. (16) and (1), Eq (11) can be reduced to:

$$\frac{Q_{SiH4}}{Q_{tot}} \geq 3.44 \cdot 10^{-5} \frac{1-\xi}{\xi}(\alpha_2 - \alpha_1)\delta r_1 = 1.66 \cdot 10^{-3} r_1 \quad (18)$$

where $r_1$ is in units of Ångstrom/sec. The numerical factor of Eq (18) is a weak function of temperature, varying only by about 40% when the deposition temperature varies from 400° C. to 1000° C. Therefore, Eq. (18) can be generalized is follows:

$$\frac{Q_{RLC}}{Q_{tot}} \geq 10^{-25} [RLE]_{film} \frac{\sqrt{(M_{RLC}^{-1} + M_{mean}^{-1})}}{\sigma_{RLC}^2 \Omega_{RLC}} \frac{1-\xi}{\xi}(\alpha_2 - \alpha_1)\delta r_1 \quad (19)$$

where $[RLE]_{film}$, $r_1$, and $\sigma_{RLC}$ are in units of in units of cm$^{-3}$, Ångstrom/sec, and Ångstrom, respectively.

Influence of Microstructure Design on the Microloading Effect

In the foregoing discussion, it has been assumed that the CVD film deposition is performed on structures remote from each other with different area density. However, most useful chips have different microstructures in close proximity to each other. For instance, a high-density memory array may be adjacent to a low-density logic circuitry. The case of adjacent microstructures can be analyzed as follows. If the characteristic size of the microstructure is smaller than the parameter $\delta$, then the supply of rate-limiting chemical is due to the current across the gap (stagnant layer) and the current along the wafer surface. In fact, when the size of a very dense microstructure is much smaller than the gap width, the chemical supply is mainly due to the transport along the wafer surface. In this limiting case, a flow rate criterion may be derived which is similar to Eq. (19). It can be shown that Eq. (19) is replaced with a similar equation:

$$\frac{Q_{RLC}}{Q_{tot}} \geq 10^{-25} [RLE]_{film} \frac{\sqrt{(M_{RLC}^{-1} + M_{mean}^{-1})}}{\sigma_{RLC}^2 \Omega_{RLC}} \left( \frac{1-\xi}{\xi} + \frac{\alpha_1}{\alpha_2} \frac{\delta}{\delta_1} \right) \alpha_2 \delta_1 r \quad (20)$$

where $\delta_1$ is the characteristic size of the smaller microstructure with the surface area ratio of $\alpha_2$. For most practical cases, the term $(\alpha_1 \delta / \alpha_2 \delta_1)$ can be omitted due to the fact that the microloading effect is severe only when a relatively large microstructure with a substantially high surface area ratio is adjacent to a substantially flat area. This assumption yields an equation which is very similar to Eq (19). The new criterion will be different from Eq. (19) only by a geometrical form factor of the order of unity. This form factor is not important for the analysis and can be considered as a part of the error in determining the numerical factor of Eq (19). Similarly, in the case when both diffusion currents are important the criterion will be different from Eq (19) only with a numerical factor of the order of unity. Therefore, a flow rate criterion for avoiding the microloading effect when there are two adjacent microstructures may be expressed as follows:

$$\frac{Q_{RLC}}{Q_{tot}} \geq 10^{-25} [RLE]_{film} \frac{\sqrt{(M_{RLC}^{-1} + M_{mean}^{-1})}}{\sigma_{RLC}^2 \Omega_{RLC}} \frac{1-\xi}{\xi} (\alpha_2 - \alpha_1) \delta_1 r_1 \quad (21)$$

where $\delta_1$ is the lesser of the stagnant layer thickness, the gap width, or the characteristic size of the smaller microstructure.

Determining Susceptibility to the Microloading Effect

A noteworthy and non-obvious result follows from Equation (21): the degree of microloading depends on the product of microstructure density and its characteristic size. If the characteristic size of the microstructure is smaller than some critical value the microloading effect is negligible even for very dense microstructures. We estimate such critical size of the microstructure in the worst practical case for the deposition of silicon nitride: the dilution ratio is 0.001, the growth rate is 10 Å/s, the parameter $(\alpha_2 - \alpha_1)$ is 10, the allowed degree of microloading is 3% ($\epsilon = 0.03$). We have found that if the characteristic size of a microstructure is less than 33 $\mu$m then the microloading effect is negligible. Therefore, in order to assess the susceptibility of a particular chip design to the microloading effect, one may perform the following procedure:

a) determine the total surface area of the chip (wafer) from the pattern density and the aspect ratio of the structures; the ratio of the total surface area of the chip (wafer) to the chip (wafer) area will be an average value of the parameter $\alpha$ ($\alpha$av);

b) create a chip (wafer) map of the parameter $\alpha$ by determining the surface area of the 1000 $\mu$m$^2$ squares;

c) determine the characteristic size $\delta_1$ of various microstructures; the microstructure border is defined in the (x,y) plane by an equation $\alpha(x,y) = \alpha_{av}$; the characteristic size is the minimal diameter of a circumference with the center at the microstructure border such that a plurality of these circumferences can cover the entire microstructure;

d) determine the average of parameter $\alpha$ within each microstructure, $\alpha_{av}$;

e) determine the wafer susceptibility to the microloading effect by finding the largest product of microstructure characteristic size and the difference of its average surface area factor and the wafer average surface area factor $(\alpha_{max} - \alpha_{av}) \delta_{1max}$; and f) if $(\alpha_{max} - \alpha_{av}) \delta_{1max} > 300$ $\mu$m then the wafer is considered to be susceptible to the microloading effect in a single wafer (or small-batch) CVD reactor. In order to deposit a uniform film onto microloading-susceptible wafers, the deposition conditions should satisfy the criterion expressed by a modified version of Eq (21):

$$\frac{Q_{RLC}}{Q_{tot}} \geq 10^{-25} [RLE]_{film} \frac{\sqrt{(M_{RLC}^{-1} + M_{mean}^{-1})}}{\sigma_{RLC}^2 \Omega_{RLC}} \frac{1-\xi}{\xi} (\alpha_{max} - \alpha_{av}) \delta_{1max} r_1 \quad (22)$$

It is noteworthy that the chamber pressure does not explicitly appear in Eq. (22); this is contrary to various references (e.g. S. Wolf et al.) that suggest that CVD reactors can operate in the reaction-limited regime only at a low pressure (<1 Torr). However, the chamber pressure may affect the growth rate $r_1$. A typical LPCVD process conducted in a large-batch (~100 wafers) furnace at 1–0.01 Torr can have a growth rate of 0.1–0.01 Å/s with a throughput of approximately 20 wafers/hour. Depending on the type of rate-limiting precursor the dilution factor ($Q_{RLC}/Q_{tot}$) varies from 0.3 to 0.001. Apparently, due to the low growth rate the criterion (21) is satisfied over a broad range of the parameter $\alpha_{max} \delta_{1max}$ and of the dilution factor. This is consistent with the fact that the microloading effect is not observed in an LPCVD furnace. On the other hand, a typical single wafer (or small-batch) CVD reactor should maintain a substantially higher growth rate to support a competitive throughput. For a typical film thickness of 100–500 Å, the growth rate should be above 1 Å/s (preferably 10 Å/s) to maintain a competitive throughput. For instance, single-wafer CVD of silicon nitride is typically conducted using the following conditions: chamber pressure 275 Torr, dilution ratio 0.001, and growth rate (on the blanket wafer) 12 Å/s. For a dense embedded memory array, $\delta_{1max}$ can be as large as 1 cm while $\alpha_{max}$ and $\alpha_{av}$ are typically 2.5 and 1.5, respectively. In the case of silicon nitride deposition, the criterion (22) is satisfied only for the parameter $\epsilon$ higher than 0.5. This means that the film thickness can vary by a factor of two, which is clearly unacceptable. Equation (22) appears to require that to reduce the microloading effect, either the growth rate must be reduced or the dilution factor must be increased.

Reducing Microloading: Dilution Ratio and Growth Rate Adjustment

In accordance with the foregoing discussion, a method for reducing the microloading effect in a high-throughput single-wafer CVD reactor is as follows:

1. The susceptibility of the wafer to the microloading effect is determined by evaluating the parameter $(\alpha_{max}-\alpha_{av})\delta_{1max}$.
2. A maximum acceptable dilution ratio is determined. Requirements relating to film quality (particularly the chemical composition of the film) generally limit the dilution factor. For instance, in the case of silicon nitride deposition from $SiH_4$ and $NH_3$ the dilution ratio should be smaller than approximately 0.01 in order to avoid the formation of silicon-rich silicon nitride. Each application may require a different film composition, so that the maximum acceptable dilution ratio may vary.
3. The growth rate is reduced, independently of the dilution ratio, to satisfy the criterion in Eq.(22). The growth rate can be reduced by either reducing the chamber pressure or deposition temperature, or by introducing a chemical inhibitor. Each of these methods for reducing the growth rate has limitations. For example, the chamber pressure cannot be reduced below some limit due to the pump capacity or flow pattern limitation; a low deposition temperature may result in a poor film quality; and introduction of a large flow of an inhibitor can substantially change the dilution ratio and flow pattern. A combination of these methods can be used to achieve the desired growth rate. It is known that a chemical inhibitor is a substance which reduces the rate of the reaction when added in relatively small quantities. For instance, $H_2$ or HCl can be used as inhibitors when $SiH_4$ or $SiH_2Cl_2$ are RLC used for silicon nitride deposition. The reduction of the growth rate is limited by the requirement of high throughput, $r_1 \geq 1$ Å/s . Therefore, this method is somewhat limited in preventing microloading during deposition on highly-susceptible wafers $((\alpha_{max}-\alpha_{av})\delta_{1max}>3000 \mu m)$.

Reducing Microloading: Wafer/showerhead Gap Reduction

Figure 6:
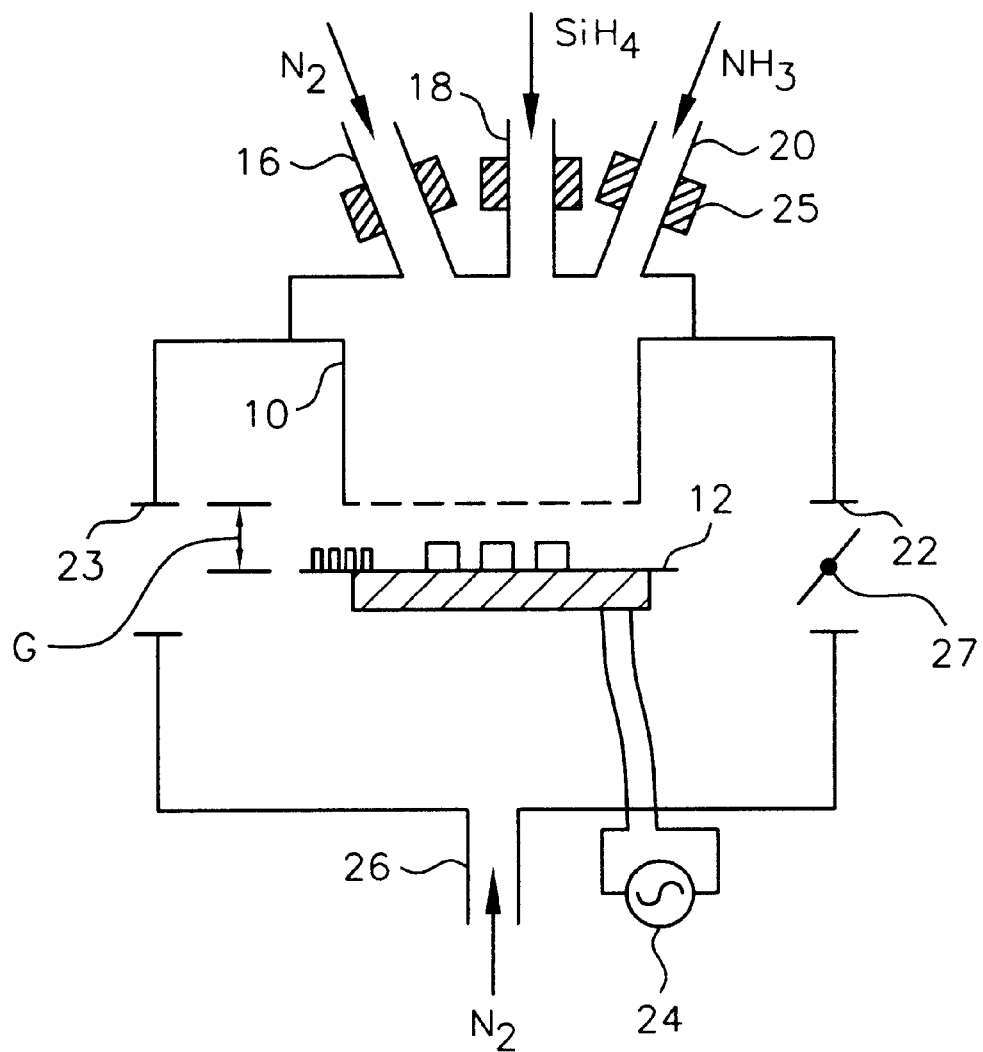
FIG. 6 is a schematic illustration of a single-wafer CVD reactor with a narrow gap between the gas showerhead and the substrate, in accordance with an embodiment of the invention.

Wafers which are highly susceptible to the microloading effect $((\alpha_{max}-\alpha_{av})\delta_{1max}>3000 \mu m)$. typically have a large-size microstructure. If the width of the gap G between the gas showerhead 10 and the wafer 12 is reduced below 5 mm (see FIG. 6), the parameter $\delta_{1max}$ is typically also reduced. An extremely small gap of approximately 10 $\mu m$ can cause a sonic gas flow in the duct. Such a flow is associated with a large pressure gradient which can cause severe variation of the deposition rate. Accordingly, the lower limit of the gap width should be about 50 $\mu m$ while 100 $\mu m$ is the preferred gap width. After reducing the gap width the criterion (22) may be satisfied; if necessary the dilution ratio and growth rate may also be adjusted, as discussed above.

Reducing Microloading: Substitution of Carrier Gas

Microloading may also be reduced by taking advantage of thermal diffusion transport effects. It is known that in the presence of strong thermal gradient there is a thermal diffusion flux of lighter molecules to the hotter regions. That is, in the gas mixture with the average molecular weight $M_{mean}$ a molecule with a weight smaller than $M_{mean}$ moves into the hotter region due to the thermal gradient. In a single-wafer CVD reactor, the substrate 12 is hotter than the showerhead 10, and accordingly there is a strong thermal gradient in the gas mixture.

In order to take advantage of this effect, the neutral carrier gas may be chosen from among the heavy-molecule neutral gases (e.g. Ar, Kr, and Xe) to make the average molecular weight $M_{mean}$ larger than that of the RLC. In this case, a positive thermal diffusion flux would appear on the right hand side of Eq (4):

$$A\frac{d[SiH_4]}{dt}\bigg|_S = A(j_{diff} + j_{Dt}) = A\left(j_{diff} + D_{RLC}^T \frac{\Delta T}{\delta}\right). \quad (23)$$

The inclusion of a positive thermal diffusion flux (compare Eq. (23) with Eq. (4)) results in the criterion (22) being easier to meet. This method can be combined with other methods described above for maximum benefit in reducing the microloading effect.

While the invention has been described in detail herein in accordance with certain preferred embodiments thereof, modifications and changes therein may be effected by those skilled in the art. Accordingly, it is intended by the appended claims to cover all such modifications and changes as fall within the true spirit and scope of the invention.

We claim:

1. A method for reducing the microloading effect in a chemical vapor deposition (CVD) process for depositing a film on a substrate in a CVD reactor, the CVD process using a gas mixture having at least one gaseous reactant and a carrier gas, the CVD process being characterized by a reactor chamber pressure, a deposition temperature and a film growth rate, the method comprising the steps of:
    identifying a growth-rate-limiting reactant, where the film growth rate varies in accordance with a concentration of said reactant in the CVD reactor;
    calculating a dilution factor, the dilution factor being a ratio of a gas flow of the growth-rate-limiting reactant to a total gas flow rate in the reactor; and
    adjusting at least one of the film growth rate and the dilution factor to satisfy a numerical criterion for reducing the microloading effect, said criterion being satisfied when the dilution factor is not less than a first quantity including as factors (a) the film growth rate and (b) a parameter characterizing variation of surface area of the substrate,
    wherein the process has a prescribed minimum film growth rate, and said adjusting is performed subject to the minimum film growth rate.

2. A method according to claim 1, wherein the film growth rate and the dilution factor are adjusted independently.

3. A method according to claim 1, wherein the CVD process is performed in a single-wafer reactor.

4. A method according to claim 1, wherein the film growth rate is reduced in said adjusting step.

5. A method according to claim 4, wherein the film growth rate is reduced by at least one of
    reducing the chamber pressure,
    reducing the deposition temperature, and
    adding a chemical inhibitor to the gas mixture.

6. A method according to claim 1, further comprising the step of establishing an acceptable degree of microloading, and wherein said first quantity includes as a factor an expression including the acceptable degree of microloading.

7. A method according to claim 1, wherein the substrate has a microstructure with a characteristic size, an aspect ratio and a pattern density, and wherein the method further comprises the step of evaluating a second quantity based on said characteristic size, said aspect ratio and said pattern density to determine a susceptibility of the substrate to the microloading effect.

8. A method according to claim 1, further comprising the step of determining a maximum dilution factor in accordance with desired properties of the film, and wherein said adjusting is performed subject to the maximum dilution factor.

9. A method according to claim 1, wherein the CVD reactor includes a gas distribution structure above the substrate, and wherein the method further comprises the step of adjusting a distance between the gas distribution structure and the substrate to satisfy the numerical criterion.

10. A method according to claim 9, wherein the first quantity includes as a factor a characteristic distance, and reducing the distance between the gas distribution structure and the substrate reduces the characteristic distance, thereby reducing the first quantity.

11. A method according to claim 9, wherein the distance between the gas distribution structure and the substrate is adjusted to be less than about 5 mm.

12. A method according to claim 9, wherein the distance between the gas distribution structure and the substrate is adjusted to be in the range of about 50 $\mu$m to about 5 mm.

13. A method according to claim 9, wherein the distance between the gas distribution structure and the substrate is adjusted to be about 100 $\mu$m.

14. A method according to claim 1, further comprising the step of selecting a carrier gas having a molecular weight such that a mean molecular weight of the gas mixture is greater than a molecular weight of the growth-rate-limiting reactant.

15. A method according to claim 14, wherein the first quantity includes as a factor an expression which depends on the mean molecular weight of the gas mixture and the molecular weight of the growth-rate-limiting reactant, so that said selecting reduces the first quantity.

16. A method for reducing the microloading effect in a chemical vapor deposition (CVD) process for depositing a film on a substrate in a CVD reactor, the CVD process using a gas mixture having at least one gaseous reactant and a carrier gas, the CVD reactor having a gas distribution structure above the substrate, the method comprising the steps of:
  identifying a growth-rate-limiting reactant, where the film growth rate varies in accordance with a concentration of said reactant in the CVD reactor;
  calculating a dilution factor, the dilution factor being a ratio of a gas flow of the growth-rate-limiting reactant to a total gas flow rate in the reactor; and
  reducing a distance between the gas distribution structure and the substrate to satisfy a numerical criterion for reducing the microloading effect, said criterion being satisfied when the dilution factor is not less than a quantity including said distance as a factor.

17. A method according to claim 16, wherein the distance between the gas distribution structure and the substrate is adjusted to be in the range of about 50 $\mu$m to about 5 mm.

18. A method according to claim 16, wherein the distance between the gas distribution structure and the substrate is adjusted to be about 100 $\mu$m.

19. A method according to claim 16, further comprising the step of selecting a carrier gas having a molecular weight such that a mean molecular weight of the gas mixture is greater than a molecular weight of the growth-rate-limiting reactant.

20. A method according to claim 19, wherein the quantity includes as a factor an expression which depends on the mean molecular weight of the gas mixture and the molecular weight of the growth-rate-limiting reactant, so that said selecting reduces the quantity.

* * * * *